(12) United States Patent
Dykstra et al.

(10) Patent No.: US 10,408,021 B2
(45) Date of Patent: Sep. 10, 2019

(54) MANAGING A WELLSITE OPERATION WITH A PROXY MODEL

(71) Applicant: Halliburton Energy Services, Inc., Houston, TX (US)

(72) Inventors: Jason D. Dykstra, Houston, TX (US); Qiuying Gu, Lubbock, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 448 days.

(21) Appl. No.: 15/025,408

(22) PCT Filed: Oct. 18, 2013

(86) PCT No.: PCT/US2013/065670
§ 371 (c)(1),
(2) Date: Mar. 28, 2016

(87) PCT Pub. No.: WO2015/057242
PCT Pub. Date: Apr. 23, 2015

(65) Prior Publication Data
US 2016/0230513 A1    Aug. 11, 2016

(51) Int. Cl.
*G05D 7/00* (2006.01)
*G05D 11/00* (2006.01)
*E21B 41/00* (2006.01)
*E21B 43/26* (2006.01)
*E21B 47/00* (2012.01)
(Continued)

(52) U.S. Cl.
CPC .......... *E21B 41/0092* (2013.01); *E21B 33/13* (2013.01); *E21B 43/26* (2013.01); *E21B 47/00* (2013.01); *G05B 13/041* (2013.01); *E21B 2041/0028* (2013.01)

(58) Field of Classification Search
CPC .. E21B 47/00; E21B 2041/0028; E21B 33/13; E21B 41/0092; E21B 43/26; G05B 13/041
See application file for complete search history.

(56) References Cited

U.S. PATENT DOCUMENTS 7,171,310 B2 * 1/2007 Haugland ................ G01V 3/28
324/339
7,516,793 B2    4/2009 Dykstra
8,280,635 B2    10/2012 Ella et al.
(Continued)

OTHER PUBLICATIONS

PCT International Search Report and Written Opinion of the International Searching Authority, PCT/US2013/065670, dated Jul. 8, 2014, 10 pages.
(Continued)

*Primary Examiner* — Zhipeng Wang
(74) *Attorney, Agent, or Firm* — Thomas Rooney; Parker Justiss, P.C.

(57) ABSTRACT

Techniques for managing a hydraulic fracturing operation include receiving a selection of a proxy model that represents a first principles model of a hydraulic fracturing operation, the proxy model including at least one property of a plurality of properties of the first principles model associated with the hydraulic fracturing operation; simulating the selected proxy model to generate a modeled output based on the property; and determining a value of a control setpoint for hydraulic fracturing operation equipment based on the modeled output.

21 Claims, 7 Drawing Sheets

(51) Int. Cl.
*E21B 33/13* (2006.01)
*G05B 13/04* (2006.01)

(56) References Cited

U.S. PATENT DOCUMENTS

| | | | |
|---|---|---|---|
| 2008/0077371 A1 | 3/2008 | Yeten et al. | |
| 2008/0208478 A1 | 8/2008 | Ella et al. | |
| 2009/0164129 A1* | 6/2009 | Sayers | G01V 1/30 |
| | | | 702/11 |
| 2009/0182694 A1 | 7/2009 | Boulatsel et al. | |
| 2009/0234625 A1* | 9/2009 | Zangl | E21B 49/00 |
| | | | 703/10 |
| 2010/0000727 A1 | 1/2010 | Webb et al. | |
| 2010/0256964 A1 | 10/2010 | Lee et al. | |
| 2011/0060572 A1* | 3/2011 | Brown | E21B 43/00 |
| | | | 703/10 |
| 2011/0272147 A1 | 11/2011 | Beasley et al. | |
| 2014/0067353 A1* | 3/2014 | Shelley | G06N 3/0427 |
| | | | 703/10 |
| 2014/0305638 A1* | 10/2014 | Kresse | E21B 47/00 |
| | | | 166/250.1 |
| 2015/0041120 A1* | 2/2015 | Gumarov | E21B 43/26 |
| | | | 166/250.1 |
| 2015/0066447 A1* | 3/2015 | Lin | G06F 17/5018 |
| | | | 703/2 |
| 2015/0204174 A1* | 7/2015 | Kresse | E21B 43/26 |
| | | | 166/250.01 |

OTHER PUBLICATIONS

Landmark—A Halliburton Company, "Proven Solutions", Published in 2001, 32 pages.
Chemical Online, "Best-Rated Simulation Package—Makes Hyprotech Vendor of Choice", Mar. 13, 2000, 3 pages. http://www.chennicalonline.com/doc/best-rated-simulation-package-makes-hyprotech-0001.
Landmark, "Landmark/Client Team Prepares Integrated Conceptual Development Plan in Eight Weeks", Copyright 2013, 4 pages.
Fevang et al., "Vertical Lift Models Substantiated by Statfjord Field Data", SPE 154803, Copyright 2012, 17 pages.
Schlumberger Software, "PIPESIM 2012.1.1 and PIPESIM 2013.1.1 Service Pack Now Available", Feb. 14, 2014, 1 page. https://www.software.slb.com/software-news/support-news/pipesim-2012-1-1-and-pipesim-2013-1-1-. . . .
Arabian Oil & Gas Staff, "Keep on Running: Asset Management", Apr. 10, 2012, 3 pages. http://www.arabianoilandgas.com/article-10147-keep-on-running-asset-managemetn/2/.
Schlumberger, "Petrel 2012 Delivers Software Platform for Improved E&P Decision Making", Aug. 2012, 2 pages. http://www.slb.com/news/press-releases/2012/2012_0809_petrel2012_pr.aspx.

* cited by examiner

MANAGING A WELLSITE OPERATION WITH A PROXY MODEL

CROSS-REFERENCE TO RELATED APPLICATIONS

This application is a U.S. National Phase Application under 35 U.S.C. § 371 and claims the benefit of priority to International Application Serial No. PCT/US2013/065670, filed on Oct. 18, 2013, the contents of which are hereby incorporated by reference.

TECHNICAL BACKGROUND

This disclosure relates to managing a wellsite operation, such as a fracturing process, using one or more proxy models that represent one or more first principles models of the wellsite operation.

BACKGROUND

Designing and executing a wellsite operation, such as a hydraulic fracturing process, may include generating a virtual model of the operation, e.g., as defined by one or more algorithms that include operation data as inputs (e.g., pressures, flow rates, geologic data of a subterranean zone, and otherwise) and output setpoints for the operational equipment (e.g., valves, pumps, and otherwise). In some instances, the models can be quite complex and may take significant computing resources to define, generate, and/or update. For instance, during the wellsite operation, the model may not accurately represent a real-time, or current, state of the operation and may need to be updated. Updating the model, however, may unacceptably delay and/or slow down the operation.

DETAILED DESCRIPTION

Figure 1:
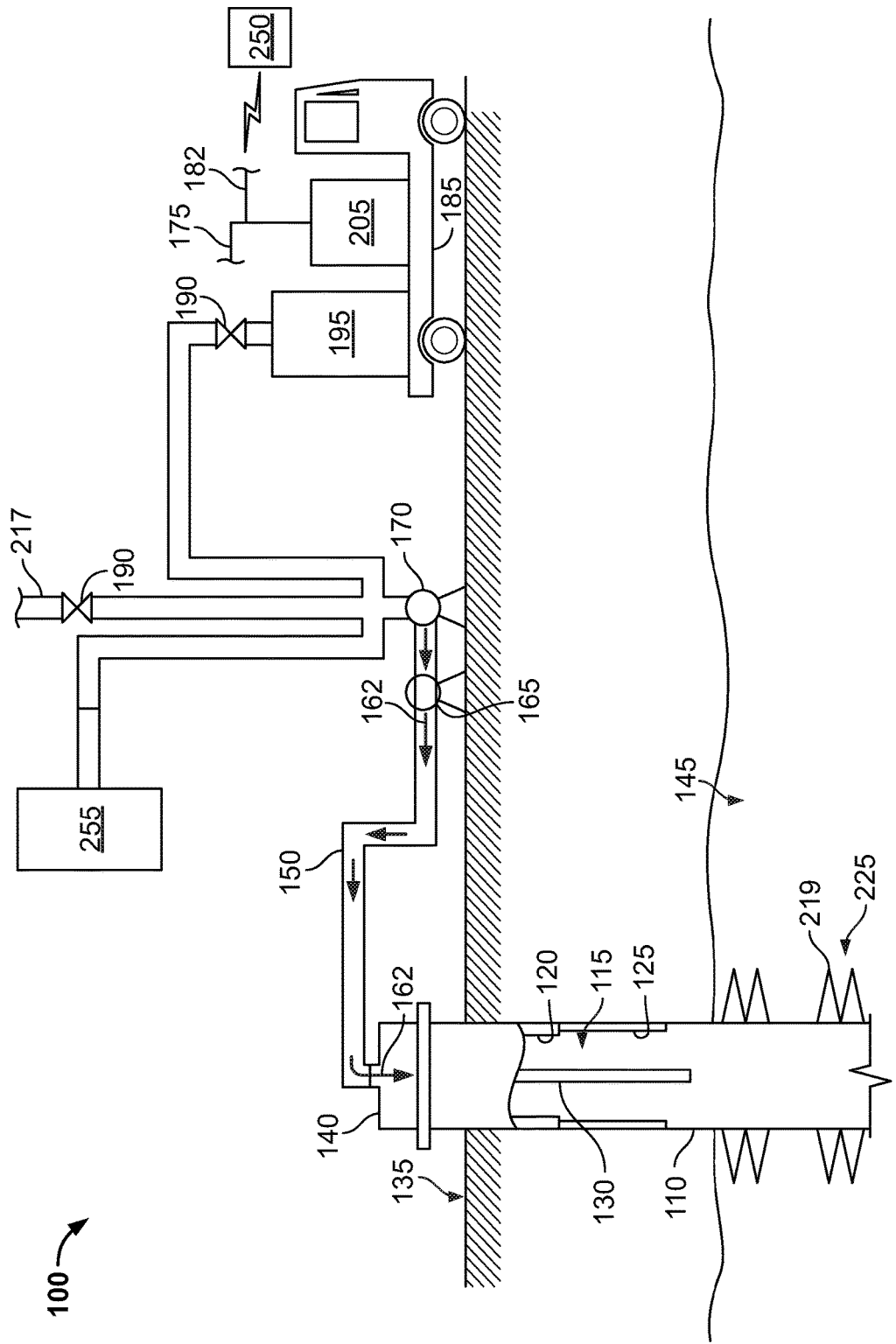
FIG. 1 illustrates an example implementation of at least a portion of a wellsite assembly in the context of a downhole operation (e.g., a fracturing operation)

The present disclosure describes, generally, illustrative systems and methods for managing production of subterranean reservoirs, including upstream production systems. In one general implementation of the present disclosure, a computer-implemented method for managing a hydraulic fracturing operation includes receiving a selection of a proxy model that represents a first principles model of a hydraulic fracturing operation, the proxy model including at least one property of a plurality of properties of the first principles model associated with the hydraulic fracturing operation; simulating the selected proxy model to generate a modeled output based on the property; and determining, based on the modeled output, at least one of a value of a control setpoint for hydraulic fracturing operation equipment or a value of a variable manipulated by a control system communicably coupled to the hydraulic fracturing operation equipment.

Other general implementations include corresponding computer systems, apparatus, and computer programs recorded on one or more computer storage devices, each configured to perform the actions of the methods. A system of one or more computers can be configured to perform operations to perform the actions. One or more computer programs can be configured to perform particular operations or actions by virtue of including instructions that, when executed by data processing apparatus, cause the apparatus to perform the actions.

In a first aspect combinable with any of the general implementations, the selected proxy model represents a first principles model of the hydraulic fracturing.

A second aspect combinable with any of the previous aspects further includes identifying a command to update a plurality of proxy models that include the selected proxy model.

A third aspect combinable with any of the previous aspects further includes updating the plurality of proxy models with the first principles model.

In a fourth aspect combinable with any of the previous aspects, the command includes at least one of: an instruction from an operator of the hydraulic fracturing operation; a predetermined time delay; a receipt of updated measured data associated with the hydraulic fracturing operation; or a determination that a deviation of model outputs of the plurality of proxy models and model outputs of the first principles model exceeds a threshold.

In a fifth aspect combinable with any of the previous aspects, updating the plurality of proxy models with the first principles model includes adjusting the first principles model with the updated measured data associated with the hydraulic fracturing operation to generate updated model outputs of the first principles model; adjusting the plurality of proxy models based on the adjusted first principles model to generate a plurality of updated model outputs of the proxy models; comparing the plurality of updated model outputs of the proxy models with the updated measured data; and based on one or more deviations determined by the comparison, further adjusting the plurality of updated model outputs of the proxy models.

A sixth aspect combinable with any of the previous aspects further includes adjusting the modeled output based on measured data associated with the hydraulic fracturing operation.

A seventh aspect combinable with any of the previous aspects further includes determining the control setpoint for hydraulic fracturing operation equipment based on the adjusted modeled output.

In an eighth aspect combinable with any of the previous aspects, adjusting the modeled output based on measured data associated with the hydraulic fracturing operation includes adjusting the modeled output by a control algorithm that optimizes an objective function by an optimization process, the optimization process including a combination of a prediction technique and an optimization technique; and correcting the adjusted modeled output for one or more prediction errors of the selected proxy model.

In a ninth aspect combinable with any of the previous aspects, the prediction technique includes a single selected model and the optimization technique includes a standard model predictive control.

In a tenth aspect combinable with any of the previous aspects, the prediction technique includes a fuzzy logic inference, and the optimization technique includes a fuzzy logic model predictive control.

In an eleventh aspect combinable with any of the previous aspects, the objective function includes a cost function that includes a weighting factor, an estimated final fracture conductivity, and a desired final fracture conductivity.

A twelfth aspect combinable with any of the previous aspects further includes minimizing the cost function; and adjusting the selected proxy model based on an output of the minimized cost function.

In a thirteenth aspect combinable with any of the previous aspects, the property includes one or more of a fracture geometry, fracture dimensions, or conductivity; and the adjusted modeled output includes at least one of a fracturing fluid flow rate, a fracturing fluid pumping schedule, a proppant pumping schedule, or a proppant rate.

A fourteenth aspect combinable with any of the previous aspects further includes controlling the hydraulic fracturing operation equipment based on the control output to hydraulically fracture a subterranean zone from a wellbore.

In a fifteenth aspect combinable with any of the previous aspects, a plurality of subterranean zones are hydraulically fractured from a plurality of wellbores based on the control output.

Certain aspects include one or more of the following features. For example, a control system according to the present disclosure may automate a wellsite operation (e.g., a hydraulic fracturing process), thereby reducing cost and/or computational burden. As another example, control optimization may be performed in real-time (or near real time) through one or more proxy models. As another example, one or more proxy models may be used within a control system that controls (e.g., all or partially) the wellsite operation in real time may be generated and intermittently (e.g., automatically or through user initiation) by one or more first principles models of the wellsite operation. As another example, the wellsite operation may be controlled in real time through the one or more proxy models and a fuzzy logic inference technique.

The details of one or more implementations are set forth in the accompanying drawings and the description below. Other features, objects, and advantages will be apparent from the description and drawings, and from the claims.

The present disclosure describes techniques for managing a wellsite operation, such as a hydraulic fracture operation, by using one or more proxy models to determine setpoint controls for operational equipment. The operational equipment may be surface located or sub-surface (including sub-sea) located and can include compressors, pumps, mixers, and other equipment for a hydraulic fracturing operation (or other operation). Selected proxy models (e.g., automatically or by an operator) may be simplified representations (e.g., lower order) of a first principles model that include model outputs, such as fracture length, dimensions, rock conductivity, and other modeled outputs of the operation and/or geologic formation. The selected proxy models may be optimized (as described below) and used to determine the operational setpoints and/or setpoint trajectories (e.g., rates of change of setpoints or otherwise).

In some aspects of the present disclosure, a first principles model may describe or include one or more of Earth models, reservoir models, wells models, processing and transport models, economic models, maintenance and reliability models or other models. First principles models can refer to physics-based or mechanistic equations, algorithms, and descriptions of observed behaviors, as well as combinations of these equations, algorithms, and descriptions, and further can refer to their implementation into software packages. With respect to a particular reservoir (or reservoirs), an Earth model may model one or more of the geological, geophysical or other characteristics of the reservoir. One example of an Earth model that can be used herein is PETREL, a registered trademark of Schlumberger Technology Corporation. A reservoir model may model one or more of permeability, porosity, reservoir pressure, water and oil saturations, stratigraphy, hydrocarbon volumes, reservoir drive mechanisms or other characteristics of the reservoir. One example of a reservoir model that can be used herein is NEXUS, a registered trademark of Landmark Graphics Corporation. A wells model may model, among other things, production and flow characteristics of one or more wells formed in the reservoir, including flow rate at individual wells or across all or a subset of the wells. One example of a wells model that can be used herein is PROSPER, a trademark of Petroleum Experts Ltd. A processing and transport model may model pressures, flow rates, compositions, and other characteristics of the operation of various equipment of a processing and transport system of a production and/or refining system. Some examples of processing and transport system models that can be used herein include PIPESIM, a trademark of Schlumberger Technology Corporation, for modeling the gathering and transport system aspects and HYSIS, a registered trademark of Hyprotech Ltd., for modeling aspects of the production facilities. An economic model may model one or more of economic return, net present value, payout, profit versus investment ratio or other economic factors across all or a part of a complete hydrocarbon production/refining system, taking into account current product prices, current fixed costs, and/or current variable costs. One example of an economic model that can be used herein is ARIES, a trademark of Landmark Graphics Corporation. A maintenance and reliability model may model one or more of mean time between failure or meantime to repair of the components and sub-components of all or a part of a complete hydrocarbon production/refining system and/or other operational aspects of all or a part of a complete hydrocarbon production/refining system. One example of a maintenance and reliability model that can be used herein is MAROS, a trademark of Jardine Technology Ltd.

In some aspects of the present disclosure, a proxy model may be an approximation of a first principles model. In some aspects, a proxy model may be used for predicting future control settings for control parameters for a wellsite operation, such as a hydraulic fracturing operation. In some aspects, a proxy model is a mathematical equation utilized as a proxy (e.g., derivation of the first principles, lower order of the first principles, or otherwise) for one or more first principles models. A proxy model may be a polynomial expansion, a support vector machine, a neural network, an intelligent agent, or other mathematical construct for one or more first principles models. In some aspects, a particular proxy model may represent a particular operation condition for the wellsite operation, e.g., the hydraulic fracturing operation. For example, each of multiple proxy models may represent or model a particular, distinct operation condition for the fracturing operation, and may be chosen as appropriate to discretize and/or model a current operating condition (e.g., current non-linear behavior of the operation).

FIG. 1 illustrates one implementation of at least a portion of a wellsite assembly 100 in the context of a downhole (e.g., fracturing) operation. A wellbore 110 is formed from a terranean surface 135 to and/or through a subterranean zone 145.

The illustrated wellsite assembly 100 includes a tubing system 150, a pump 165, a mixer 170, a liquid source 217; and a fracturing fluid truck 185 coupled to the tubing system 150. Although illustrated as onshore, the wellsite assembly 100 and/or wellbore 110 can alternatively be offshore or elsewhere. Further, although described in the context of a hydraulic fracturing operation, the wellsite assembly 100 may also illustrate another downhole operation that uses a fluid (e.g., a liquid, slurry, gel, or other fluid) such as an acidizing operation.

The wellbore 110, at least a portion of which is illustrated in FIG. 1, extends to and/or through one or more subterranean zones under the terranean surface 135, such as subterranean zone 145. Wellbore 110 may allow for production of one or more hydrocarbon fluids (e.g., oil, gas, a combination of oil and/or gas, or other fluid) from, for example, subterranean zone 145. The wellbore 110, in some aspects, is cased with one or more casings. As illustrated, the wellbore 110 includes a conductor casing 120, which extends from the terranean surface 135 shortly into the Earth. Other casing 125 is downhole of the conductor casing 120. Alternatively, some or all of the wellbore 110 can be provided without casing (e.g., open hole). Additionally, in some implementations, the wellbore 110 may deviate from vertical (e.g., a slant wellbore or horizontal wellbore) and/or be a multilateral wellbore.

A wellhead 140 is coupled to and substantially encloses the wellbore 110 at the terranean surface 135. For example, the wellhead 140 may be the surface termination of the wellbore 110 that incorporates and/or includes facilities for installing casing hangers during the well construction phase. The wellhead 140 may also incorporate one or more techniques for hanging tubing 130, installing one or more valves, spools and fittings to direct and control the flow of fluids into and/or from the wellbore 110, and installing surface flow-control facilities in preparation for the production phase of the wellsite assembly 110.

The tubing system 150 is coupled to the wellhead 140 and, as illustrated, provides a pathway through which one or more fluids, such as fluid 162, into the wellbore 110. In certain instances, the tubing system 150 is in fluid communication with the tubing 130 extending through the wellbore 110. The fluid 162, in the illustrated implementation of FIG. 1, is a fracturing fluid introduced into the wellbore 110 to generate one or more fractures in the subterranean zone 145.

In the implementation of FIG. 1 illustrating a hydraulic fracturing completion operation, the tubing system 150 is used to introduce the fluid 162 into the wellbore 110 via one or more portions of conduit and one or more flow control devices, the pump 165, the mixer 170, one or more valves 190 (e.g., control, isolation, or otherwise), the liquid source 217, and the truck 185. Generally, the pump 165, the mixer 170, the liquid source 217, and the truck 185 are used to mix and pump a fracturing fluid (e.g., fluid 162) into the wellbore 110.

The well assembly 100 includes gel source 195 and solids source 205 (e.g., a proppant source). Either or both of the gel source 195 and solids source 205 could be provided on the truck 185. Although illustrated as a "truck," truck 185 may represent another vehicle-type (e.g., tractor-trailer or other vehicle) or a non-vehicle permanent or semi-permanent structure operable to transport and/or store the gel source 195 and/or solids source 205. Further, reference to truck 185 includes reference to multiple trucks and/or vehicles and/or multiple semi-permanent or permanent structures.

The gel from the gel source 195 is combined with a hydration fluid, such as water and/or another liquid from the liquid source 217, and additives (e.g., proppant) from the solids source 205 in the mixer 170. Proppant, generally, may be particles mixed with fracturing fluid (such as the mixed gel source 195 and liquid source 217) to hold fractures open after a hydraulic fracturing treatment.

Notably, although the concepts described herein are discussed in connection with a hydraulic fracturing operation, they could be applied to other types of operations. For example, the wellsite assembly could be that of a cementing operation where a cementing mixture (Portland cement, polymer resin, and/or other cementing mixture) may be injected into wellbore 110 to anchor a casing, such as conductor casing 120 and/or surface casing 125, within the wellbore 110. In this situation, the fluid 162 could be the cementing mixture. In another example, the wellsite assembly could be that of a drilling operation, including a managed pressure drilling operation. In another example, the wellsite assembly could be that of a stimulation operation, including an acid treatment. Still other examples exist.

The wellsite assembly 100 also includes computing environment 250 that may be located at the wellsite (e.g., at or near the truck 185) or remote from the wellsite. Generally, the computing environment 250 may include a processor based computer or computers (e.g., desktop, laptop, server, mobile device, cell phone, or otherwise) that includes memory (e.g., magnetic, optical, RAM/ROM, removable, remote or local), a network interface (e.g., software/hardware based interface), and one or more input/output peripherals (e.g., display devices, keyboard, mouse, touchscreen, and others).

In certain implementations, the computing environment 250 may at least partially control, manage, and execute operations associated with managing distribution of the wellbore fluid 162 through the wellbore 110. For example, in some aspects, the computing environment 250 may control valves 190 that modulate a flow of the liquid source 217 and/or the gel source 195, as well as control one or more pumps such as pumps 165 and 170. In some aspects, the computing environment 250 may control one or more of the illustrated components of well assembly 100 dynamically, such as, in real-time during a fracturing operations at the wellsite assembly 100.

In the illustrated embodiment, the wellbore fluid 162 may be a hydraulic fracturing fluid that forms, e.g., due to pressure, hydraulic fractures 219 in the subterranean zone 145 (shown schematically in FIG. 1). In some aspects, the fractures 219 may increase a permeability of rock in the zone 145, thereby increasing, in some aspects, a flow of hydrocarbon fluids from the zone 145 to the wellbore 110. Fractures 219 may also include, in some aspects, naturally-occurring fractures in the rock of the zone 145. As illustrated, multiple fractures 219 may extend from multiple points of the wellbore 110 and in multiple fracture clusters 225 (e.g., sets of individual fractures 219).

In some aspects, the fracture treatment that includes the wellbore fluid 162 may be a multi-stage treatment. For example, in the multi-stage treatment, a particular zone or length of the wellbore 110 (e.g., all or a portion of a horizontal part of the wellbore 110) may be hydraulically isolated within the wellbore 110 (e.g., with packers or other devices) and a single treatment of the wellbore fluid 162 may be applied to the isolated portion to form multiple fracture clusters 225. In some aspects, the formed fracture clusters 225 may be within a single zone 145 or multiple zones 145.

Figure 2:
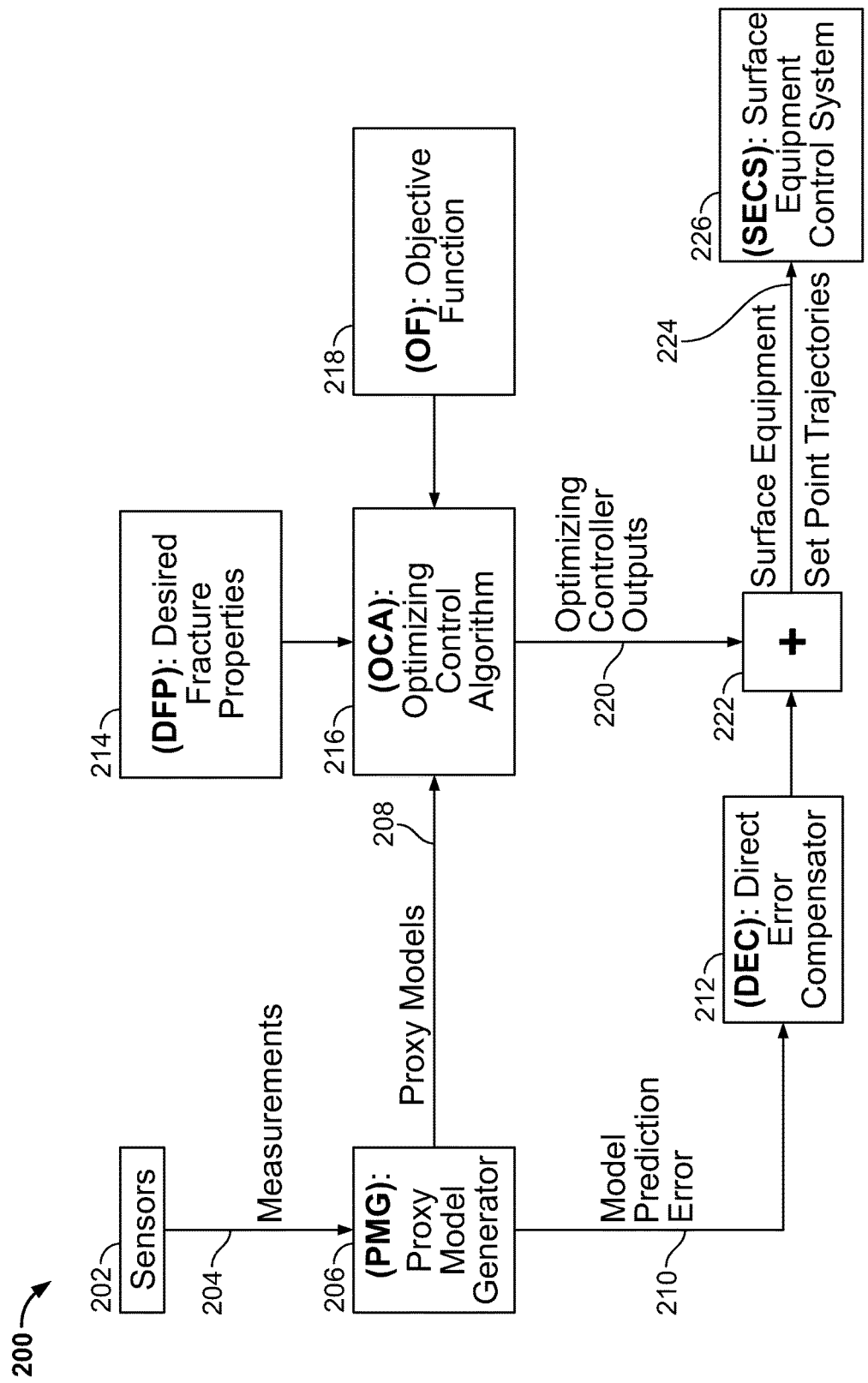
FIG. 2 is a block diagram of an illustrative wellsite operation control system that utilizes one or more proxy models to control operational equipment.

FIG. 2 is a block diagram of an illustrative wellsite operation control system 200 that utilizes one or more proxy models to control operational equipment.

In some examples, the control system 200 may be implemented in the wellsite assembly 100, such as with the computing environment 250 that is communicably coupled to, and can implement one or more control schemes for, other components of the assembly 100 (e.g., pumps 170/165, valves 190, and otherwise). In one example described herein, system 200 may control (e.g., automatically or otherwise) a wellsite operation (e.g., a fracturing process) to optimize a particular result of the operation (e.g., a final fracture condition). For instance, at a high level, setpoint trajectories of fracture fluid pumping rate, sand concentration, chemical additives, and/or other inputs are determined by the system 200 and provided to a surface equipment control system 226 (e.g., pumps 170/165, valves 190, and otherwise). Such setpoint trajectories may be updated in the system 200 (e.g., real time, near real time, or otherwise) according to, for example, updated input data (e.g., from micro seismic fracturing measurements).

At a high level, the system 200 includes a Desired Fracture Properties (DFP) 214 that defines (e.g., from user input or otherwise) a desired trajectory for a fracture propagation to take and/or a desirable final fracture condition to be achieved at the end of the fracturing process. Such DFP 214 includes, for instance, fracture geometry, fracture dimensions, proppant distribution and proppant bank formation inside the fracture, and/or dimensionless conductivity, among other properties.

The illustrated system 200 also includes sensors 202 that gather measured or observed data (measurements) 204. Sensors 202 may include above ground sensors (e.g., at the surface 135) or below ground sensors. Below ground sensors may include sensors located within the wellbore 115, within another wellbore (e.g., an offset wellbore), and/or generated fractures, such as the fractures 219. In some instances, the sensors 202 record and/or measure microseismic activity, pressure, and temperature, among other quantities. In some aspects, measured properties 204 may be determined by the sensors 202 periodically (e.g., at set intervals), when necessary, and/or at a well operator's discretion.

The system 200 also includes a Proxy Model Generator (PMG) 206 that receives, as inputs, the measured properties 204 from the sensors 202. The PMG 206 includes one or more proxy models that can be updated based on the measure properties 204. For example, the PMG 206 may use the measured properties 204 to update parameters within the one or more proxy models of the PMG 206.

The system 200 also includes an Optimizing Control Algorithm (OCA) 216. As illustrated, the OCA 216 receives the (updated) proxy models 208 from the PMG 206 and the DFP 214, as well as a selection of an Objective Function (OF) 218 as inputs. The OCA 216 provides, as an output, one or more optimizing controller outputs 220. In some aspects, the OCA 216 computes the optimizing controller outputs 220 in order to optimize the OF 218.

In some aspects, the OCA 216 may be selected from several types of algorithms. In some aspects, a selection of a particular OCA 216 may be predicated on a particular optimization method and particular prediction technique. Example optimization methods include a model-based simulation (as described with reference to FIG. 5), among others. In a model-based simulation, a model or models (e.g., the proxy models 208) are repeatedly simulated at different possible controller outputs before one output sequence is finally selected.

Example prediction techniques can include a single selected model (as described with reference to FIG. 6A) or a fuzzy logic inference (as described with reference to FIG. 6B). In some aspects, a choice of a prediction technique may be required if the model-based simulation optimization method is selected in order to predict a future fracture property (e.g., final fracture conductivity) on which the OF 218 may depend. In the single selected model, the future fracture property is provided by the model. In the fuzzy logic inference, the future fracture property may be provided based upon a decision-making rules-set that combines the predictions of several models in order to provide a final prediction. In some aspects, a particular prediction technique may be swapped to another prediction technique based on the operating conditions or the current model accuracy. For instance, if the uncertainty of the model is large, the system 200 can switch to another method, which may not require the model to make decisions. Those decisions may be made without predicting forward over a particularly long time duration in the future.

The illustrated system 200 also includes a Direct Error Compensator (DEC) 212 that, in some aspects, corrects for prediction errors from the proxy models 208 that are used by the OCA 216. The DEC 212 receives a model prediction error 210 from the PMG 206 and provides an error compensation term to a summing function 222. The summing function 222 receives the error compensation term and the optimizing controller outputs 220 and generates surface equipment setpoint trajectories 224. The setpoint trajectories are provided as control setpoints to the Surface Equipment Control System (SECS) 226.

Figure 3:
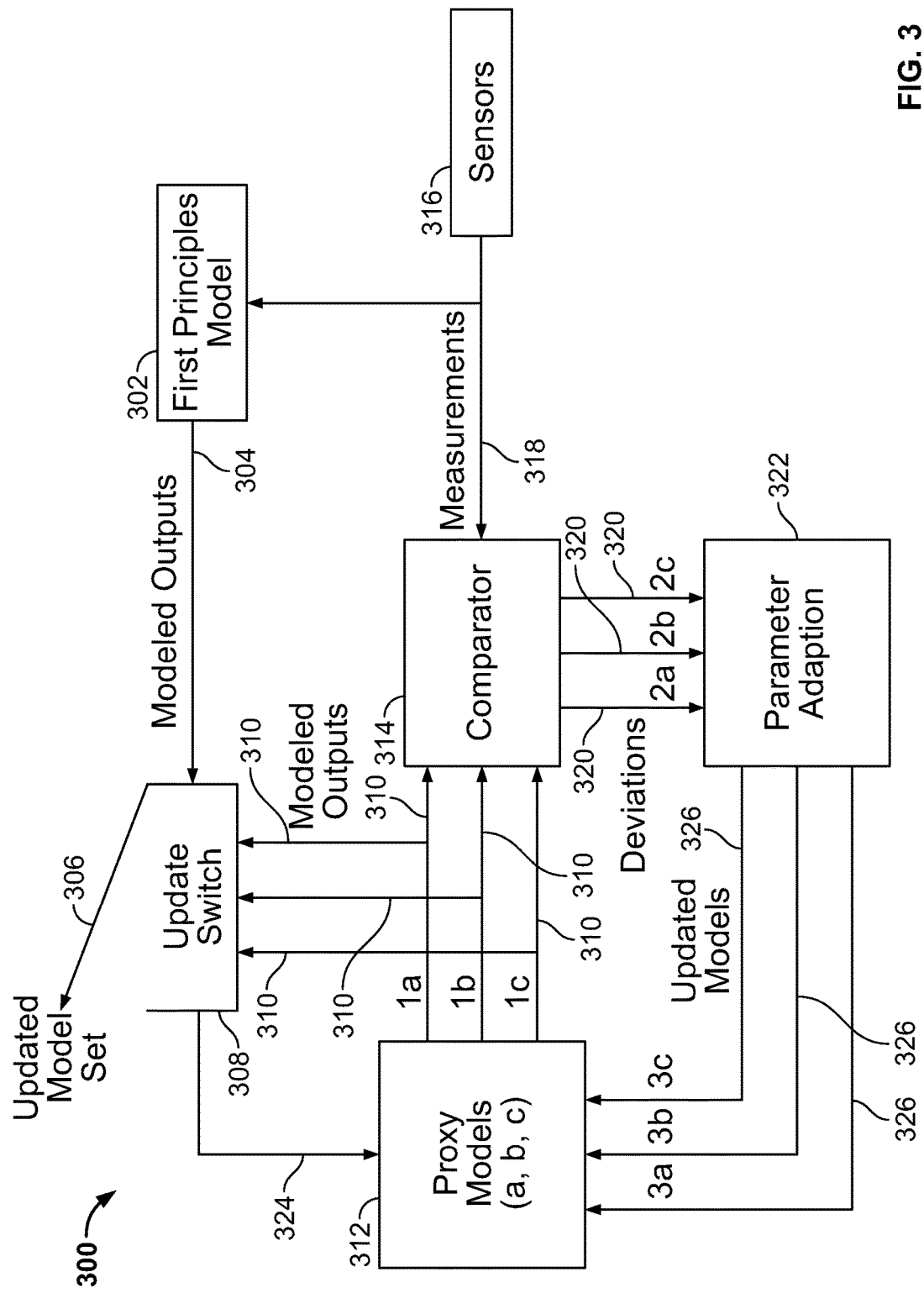
FIG. 3 is a block diagram of a proxy model generator of the illustrative wellsite operation control system of FIG. 2.

FIG. 3 is a block diagram of an example of a proxy model generator (PMG) 300 of the illustrative wellsite operation control system of FIG. 2. In some aspects, the example PMG 300 may be utilized as the PMG 206 shown in the system 200. In some aspects, a set of proxy models 312 (three shown here) may first be created and subsequently updated and/or replaced using a first principles model 302. In some aspects, the first principles model 302 may be generated by a fracture/reservoir simulator as described above.

As shown in FIG. 3, the PMG 300 includes an update switch 308 that controls the operation (e.g., updating process) of the PMG 300. When the update switch 308 is activated, one or more proxy models 312 are generated from the first principles model 302 (and its modeled outputs 304) using, for instance, conventional identification techniques while constraining the identification to a lower order representation. In some examples, this could include using the expected optimizing controller outputs and perturbations of this trajectory along with the first principles model 302 to generate a series of input-output data, and then fitting the input-output data to one or more proxy models 312.

As illustrated in FIG. 3, sensors 316 may provide updated measurements 318 to the first principles model 302 and a comparator 314. As new measurements 318 becoming available, they can be provided to the comparator 320 to generate deviations 320 relative to modeled outputs 310 from the proxy models 312. The deviations 320 are provided to a parameter adaption module 322.

In the illustrated example, parameter adaptation can be performed (e.g., by the parameter adaption module 322) on the proxy models 312. In some aspects, the parameter adaption can be performed with a nonlinear-Kalman filter or other parameter estimation technique.

As illustrated, updated measurements 318 may be provided to the first principles model 302 and the proxy models 312 (e.g., through the comparator 314 and parameter adaption module 322). If a pre-specified function of the deviations 320 is larger than a particular threshold (e.g., preset or determined by a well operator), the proxy model set 312 may be refreshed through the modeled outputs 304 (e.g., adjusted by the updated measurements 318) of the first principles model 302. In this example, the updating of the proxy model set 312 may be performed in a time frame that may be longer than real time (e.g., after a fracturing operation is completed).

The modeled outputs 304 from the first principles model 302 can adjust the structure of the proxy model set 312, while the updated models 326 from the parameter adaption module 322 may adjust parameter values in the proxy models of the set 312 (e.g., only or primarily). In some aspects, model selection can be done on a separate control system (e.g., computing environment, controller, or otherwise) that a controller of the wellsite operation (e.g., controller of the hydraulic fracturing operation). This separation may allow one or more first principles models 302 to be built and/or tested without having an unwanted effect on the computational time of the wellsite operation controller. For instance, the proxy model set 312 may allow for the use of optimization techniques within the update time frame required for real time control of the well site operation.

For example, as illustrated, the control scheme of FIG. 3 includes a "fast" (e.g., real time or near real time suitable for control of a wellsite operation such as a fracturing operation) proxy model updating scheme and a "slow" (e.g., non-real time or slower than desired for wellsite operation control) proxy model updating scheme. In some examples, for instance, the fast operation may be performed during a wellsite operation such as a hydraulic fracturing operation or other downhole operation (e.g., cementing, acidizing, or otherwise). In some examples, the slow operation may be performed prior to or after the wellsite operation.

As illustrated, the fast operation includes a control loop that includes the proxy model set 312, the comparator 314, and the parameter adaption 322. In operation, and as also described above, the sensors 316 may determine measurements 318 that are provided to the comparator 314 to compare to the modeled outputs 310 (e.g., parameters such as pumping rate, pressure, and otherwise) of the proxy models in the proxy module set 312. Deviations 320 that are output from the comparator 314 are provided to the parameter adaption module 322, where modeled outputs 310 may be adjusted based on the deviations 320. The updated outputs 326 are then provided back to the proxy model set 312 to be incorporated into the proxy models.

The illustrated slow operation includes a control loop that includes the proxy model set 312, the update switch 308, and the first principles model 302. In operation, and as also described above, the sensors 316 may determine measurements 318 that are provided to the first principles model 302 to update the modeled outputs 304 of the first principles model 302. When the update switch 308 is closed (e.g., based on a decision by a wellsite operation), the updated model set 306 of the first principles model 302, which may be all or a portion of the modeled outputs 304 of the first principles model 302, may update the modeled outputs 310 from the proxy model set 312. An updated set of modeled outputs 324 may then be provided to the proxy model set 312 from the update switch 308.

Figure 4:
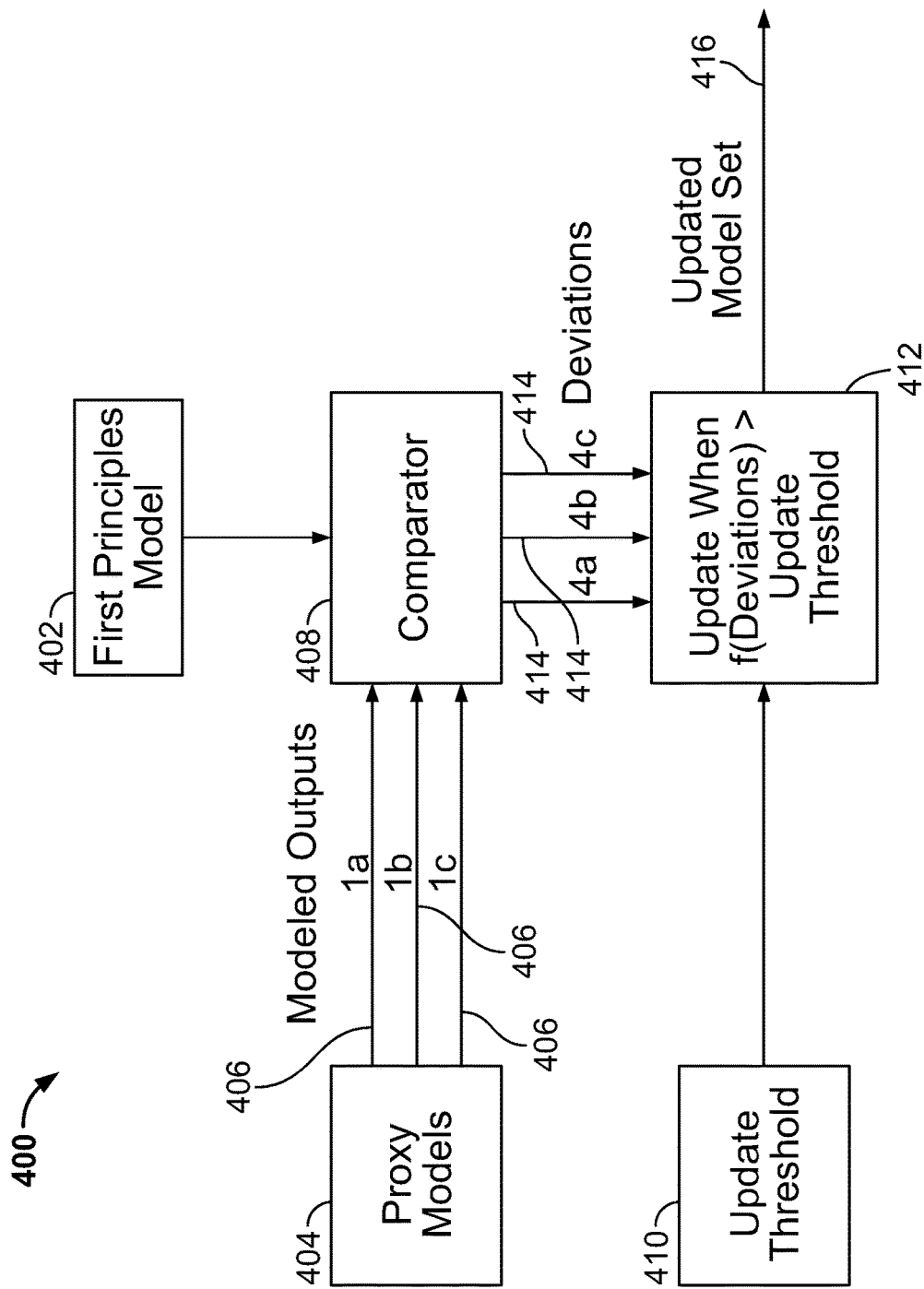
FIG. 4 is a block diagram of an update switch of the illustrative wellsite operation control system of FIG. 2.

FIG. 4 is a block diagram of an update switch 400 of the illustrative wellsite operation control system of FIG. 2. For example, in some implementations, the update switch 306 may be configured as shown as the update switch 400. In some aspects, the update switch 400 may generally function to update one or more modeled outputs or parameters of one or more proxy models based on a deviation of such parameters from corresponding (e.g., the same or similar) parameters in an updated first principles model (or alternative first principles model).

As illustrated in FIG. 4, the update switch 400 includes a comparator 408 that receives modeled outputs from a first principles model 402 and modeled outputs 406 from one or more proxy models 404 (e.g., from a set of proxy models). The update switch 400 also includes an update threshold 410, which, in some aspects, may include a numerical value (e.g., predetermined or otherwise). The update switch 400 also includes a function 412.

In operation, the comparator 408 receives the modeled outputs from the first principles model 402 and modeled outputs 406 from one or more proxy models 404 and compares the respective outputs. The comparator 408 produces deviations 414 based on, for example, differences between the modeled outputs from the first principles model 402 and the modeled outputs 406 from the one or more proxy models 404. The deviations 414 are provided to the function 412 along with the update threshold 410. The function 412, in some examples, determines when an updated model set 416 (e.g., such as the updated model set 324) is produced when a function of the deviations 414 is larger than the update threshold 410. The updated model set 416 can be incorporated into and/or replace a model set of the one or more proxy models 404 (e.g., also proxy model set 312).

Figure 5:
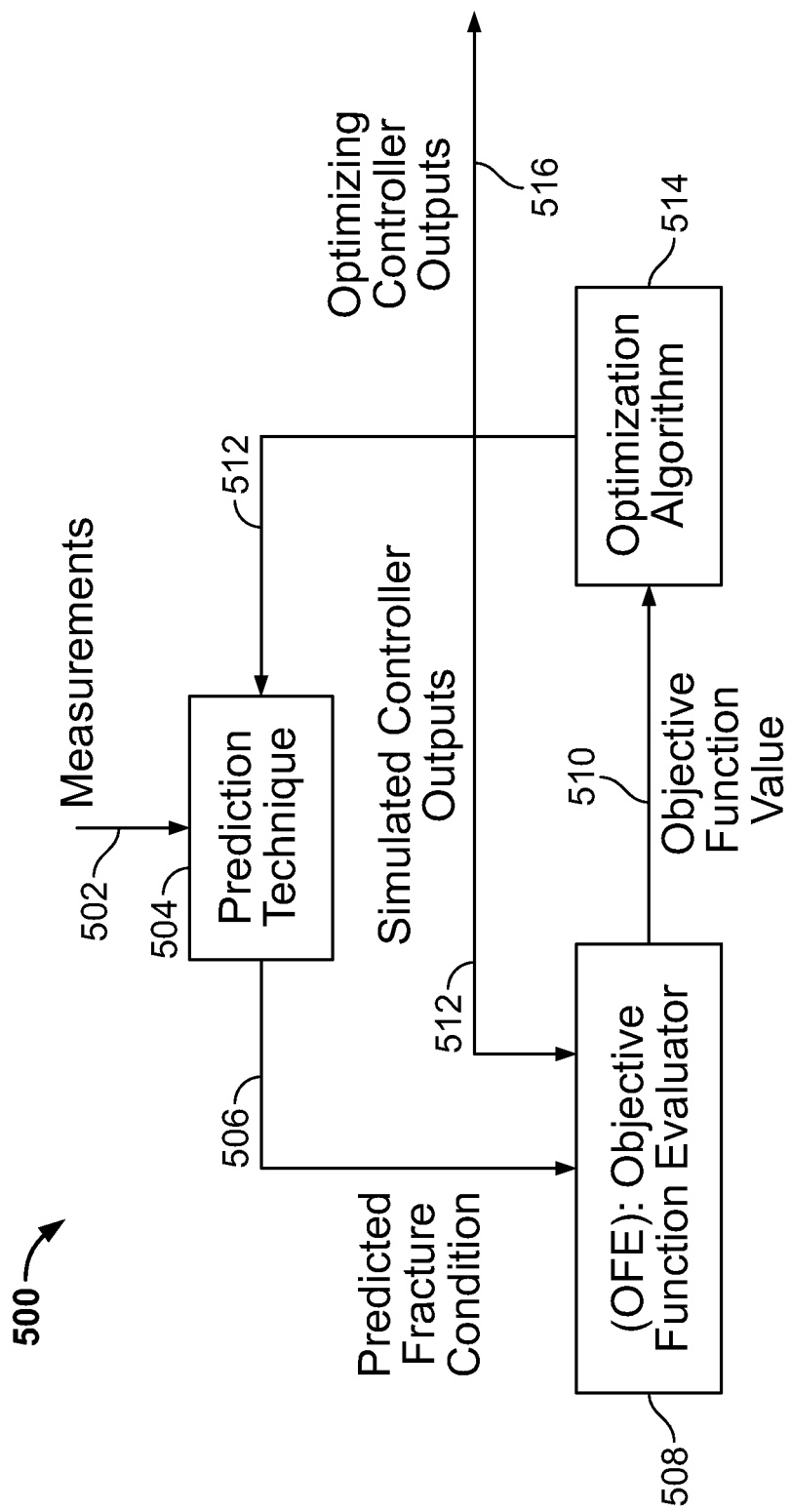
FIG. 5 is a block diagram of an example optimization technique for an optimizing control algorithm of the illustrative wellsite operation control system of FIG. 2.

FIG. 5 is a block diagram of an example optimization technique 500 (shown as a dotted line) for an optimizing control algorithm of the illustrative wellsite operation control system of FIG. 2. In some aspects, the optimization technique 500 may be implemented as Optimizing Control Algorithm (OCA) 216 in FIG. 2. Optimization technique 500, in some examples, may represent a model-based simulation technique.

Optimization technique 500, as shown, includes a prediction technique 504 (as described with reference to FIGS. 6A or 6B) that receives measurements 502 (e.g., from one or more sensors). The technique 500 further includes an Objective Function Evaluator (OFE) 508 that receives a predicted operation condition, in this case a predicted fracture condition 506, as well as simulated controller outputs 512 (e.g., controller outputs). Controller outputs, which may be simulated (e.g., 512) or optimizing (e.g., 516) may also be described as an inputs trajectory or a setpoint trajectory. In some aspects, such outputs may include and/or define a desired trajectory in time in which variables (e.g., valve positions) manipulated by a control system should maintain, as well as the set-points on other related variables (e.g., pumping rate) that individual controllers (e.g., PID type controllers) are to maintain. In some aspects, the optimizing controller output may directly specify a value that manipulated variables should take with time, while in some aspects the optimizing controller output may specify the desired output of other control loops. The OFE 508 provides an objective function value 510 to an optimization algorithm 514, which in turn provides optimizing controller outputs 516 to a controller of the particular wellsite operation, such as the fracturing operation.

In some aspects, the optimization technique 500 may be similar to a standard model predictive control (MPC) controller or a fuzzy MPC controller, e.g., depending on which prediction technique 504 is used. In some aspects, the optimization technique 500 may utilize one or more proxy models, such as the proxy models 208 (or other proxy models described herein).

When a particular prediction technique 504 is used (e.g., a single selected model prediction technique), the optimization technique may use a standard MPC algorithm. When another prediction technique 504 is used (e.g., a fuzzy logic inference), the optimization technique may use a fuzzy MPC algorithm.

The OFE 508 includes an objective function (e.g., a selected OF 218 that is provided by a wellsite operator) that, for example, may be a cost function to be minimized. Such a cost function may contain one or more terms, which could penalize deviation of the predicted wellsite operation result from a desired result (e.g., in the case of a fracturing operation, a fracture conductivity from a desired conductivity). The cost function could further, for example, penalize deviations of a current estimated fracture geometry from a desired fracture shape. The objective function could also, for instance, contain a function of economic controller outputs, which could include penalizing a usage (or overusage) of fracturing materials such as proppant and polymer gel. In some aspects, the objective function values are evaluated online according to availability of updates (e.g., an updated predicted fracture condition) from the prediction technique 504.

In one particular example, the objective function could be of the form:

$$\min(\alpha(\hat{C}_f - C^*_f)^2 + \beta f(\text{shape}) + \gamma g(\text{input\_trajectory}))$$

where $\alpha$, $\beta$, and $\gamma$ are weighting factors for the particular terms and $\hat{C}_f$ represents an estimated final fracture conductivity, while $C^*_f$ is the desired final conductivity, and f and g represent pre-defined functions. The weighting factors can be changes dependent on operational desires, or current operating conditions. For instance, the system could be weighted at the end of a wellsite operation, such as a fracturing job, by material usage (e.g., proppant usage) to ensure that the operation can be completed with material resources on site. In some implementations, other optimization techniques may be utilized in addition to or alternatively with the illustrated technique of FIG. 5.

Figure 6A:
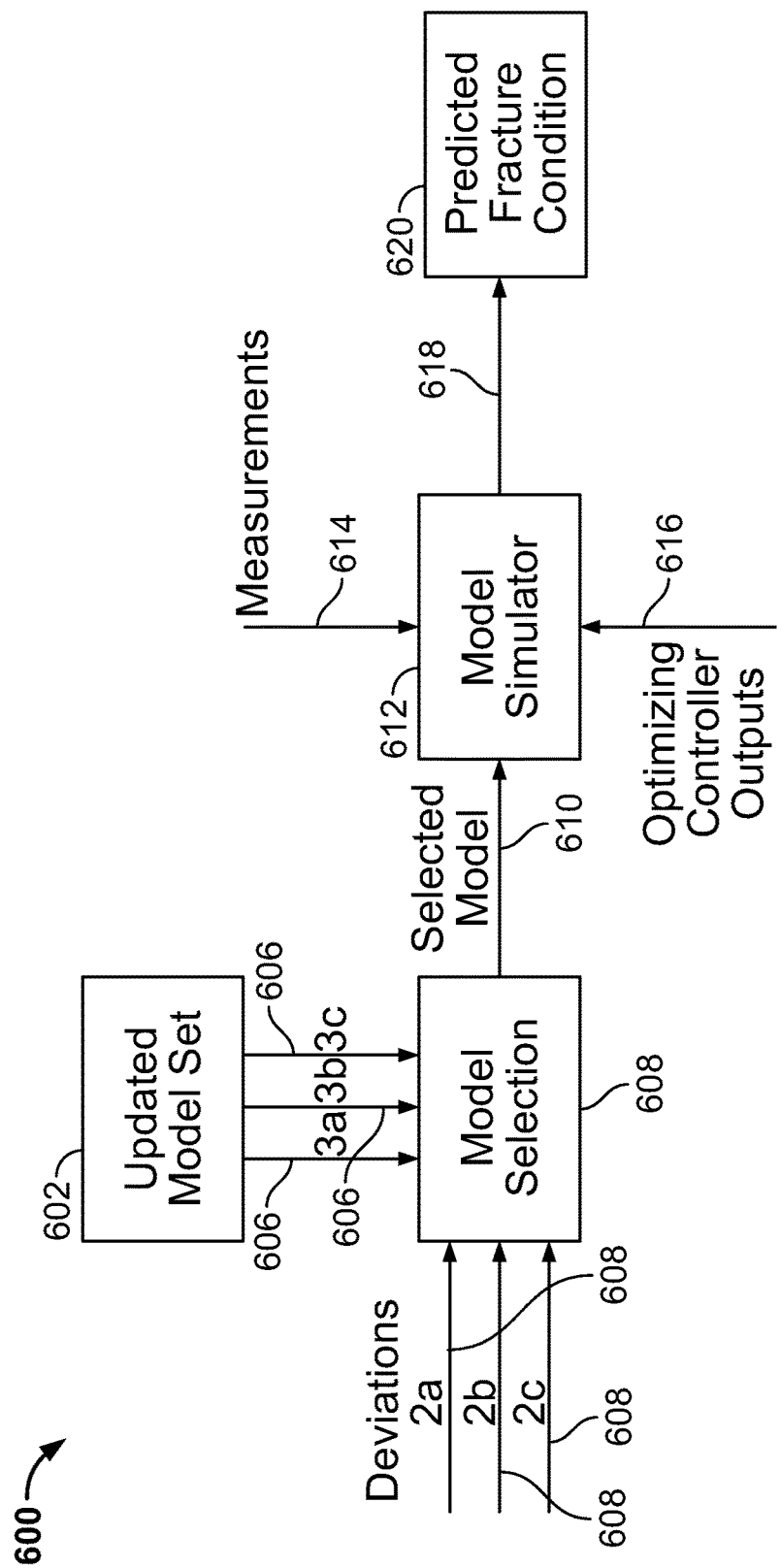
FIG. 6A is a block diagram of an example prediction technique for an optimizing control algorithm of the illustrative wellsite operation control system of FIG. 2.

FIG. 6A is a block diagram of an example prediction technique 600 for an optimizing control algorithm of the illustrative wellsite operation control system of FIG. 2. In some aspects, the prediction technique 600 may be implemented as prediction technique 504 in the optimizing technique 500. In some aspects, the prediction technique 600 may be a single selected model (e.g., a single selected proxy model). Generally, the illustrated prediction technique 600 determines how much a set of updated models (e.g., updated models 326 in FIG. 3) deviate from measurements (e.g., measurements 318). Based upon a particular criteria function, a model selection algorithm 608 chooses a particular proxy model 610. From there, the selected model 610 is simulated in a model simulator 612 in order to generate estimates 618 of a wellsite operation condition, such as a predicted fracture condition.

As illustrated in FIG. 6A, in some aspects, an updated model set 602 of updated proxy models 606 (e.g., updated models 326) and deviations 608 (e.g., from measurements) is provided to the model selection algorithm 608. The model selection algorithm 608 may select one or more proxy models of the model set 602 based on, for example, an amount of deviation that the particular proxy model(s) may exhibit. The selected model 610 may then be simulated in the model simulator 612 with measurements 614 and the optimizing controller outputs 616. The model simulator 612 may then provide an estimated output 618 of the predicted fracture condition 620, which, as shown in FIG. 5, may be used as the predicted fracture condition 506.

Figure 6B:
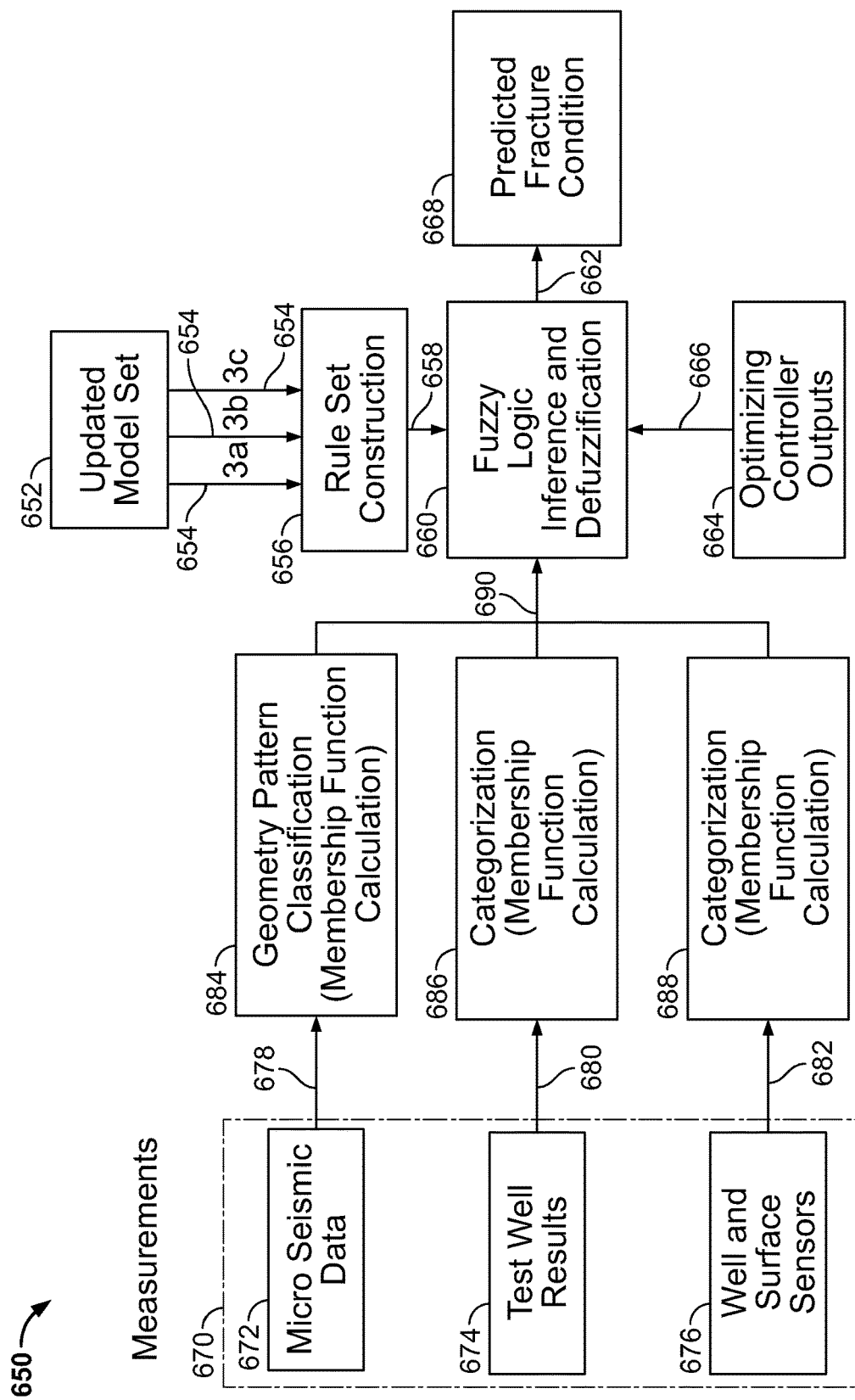
FIG. 6B is a block diagram of another example prediction technique for an optimizing control algorithm of the illustrative wellsite operation control system of FIG. 2.

FIG. 6B is a block diagram of another example prediction technique 650 for an optimizing control algorithm of the illustrative wellsite operation control system of FIG. 2. In some aspects, the prediction technique 650 may be implemented as prediction technique 504 in the optimizing technique 500. In some aspects, the prediction technique 650 may be a fuzzy logic inference technique.

Generally, an updated model set 652 (e.g., the updated model set 416) may be used in rules generation for a fuzzy logic inference system as illustrated in FIG. 6B. In the illustrated prediction technique 650, a set of measurements 670, which include measurements 678, 680, and 682 from micro seismic data 672, test well results 674, and well and surface sensors 676, respectively, is provided to multiple pre-defined categories using fuzzy membership function. In this example, for instance, measurements 678 from the micro seismic data 672 are provided to a geometry pattern classification membership function calculation (MFC) 684. Measurements 680 from the test well results 674 are provided to a categorization MFC 686. Measurements 682 from the well and surface sensors 676 are provided to another categorization MFC 688.

The MFCs 684, 686, and 688 may provide a classification 690 (e.g., of a fracture shape that is classified by a ratio of its maximum height to its maximum length) to a fuzzy logic inference and defuzzification module 660. The module 660 also receives a predicted fracture condition 658 from a rule set construction 656 that determines the predicted fracture condition 658 from updated proxy models 654 (e.g., including properties such as the estimated final fracture dimensionless conductivity). The module 660 also receives a inputs 666 from optimizing controller outputs 664. Based on these inputs and decision making logic in the module 660 (e.g., through several of the proxy models), an output 662 from the module 660 may include a predicted fracture condition 668. In this example, the optimization function could be the inferred conductivity from the fuzzy membership function, and the flow rate changed accordingly to improve the conductivity.

The illustrative workflows described in the present disclosure are provided for example sake, and one or more or all of the work flows can be changed or omitted. One or more or all of the illustrative workflows can be performed at least partially concurrently or at different times, in any order or in no order. Moreover, one or more of the steps of the illustrative workflows can also be changed or omitted. One or more or all of the steps within a given illustrative workflow can be performed at least partially concurrently or at different times, in any order or in no order.

The features described can be implemented in digital electronic circuitry, or in computer hardware, firmware, software, or in combinations of them. The apparatus can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. Elements of a computer can include a processor for executing instructions and one or more memories for storing instructions and data. Generally, a computer can also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computer system can include clients and servers. A client and server are generally remote from each other and typically interact through a network, such as the described one. The relationship of client and server arises by virtue of computer programs running on the respective computers and having a client-server relationship to each other.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

A number of implementations of the present disclosure have been described. Nevertheless, it will be understood that various modifications may be made without departing from the spirit and scope of the present disclosure. Accordingly, other implementations are within the scope of the following claims.

What is claimed is:

1. A computer-implemented method for managing a hydraulic fracturing operation, comprising:
    receiving a selection of a proxy model of a hydraulic fracturing operation, the proxy model comprising at least one property of a plurality of properties of a first principles model associated with the hydraulic fracturing operation, wherein the selected proxy model is a simplified, lower order representation of the first principles model of the hydraulic fracturing operation;
    simulating the selected proxy model to generate a modeled output based on the property;
    determining, based on the modeled output, at least one of a value of a control setpoint for hydraulic fracturing operation equipment or a value of a variable manipulated by a control system communicably coupled to the hydraulic fracturing operation equipment;
    controlling in real-time the hydraulic fracturing operation equipment based on the control setpoint or the value of the manipulated variable to hydraulically fracture a subterranean zone from a wellbore, wherein:
        the plurality of properties comprise one or more of a fracture geometry, fracture dimensions, or conductivity; and
        the generated modeled output includes a fracturing fluid flow rate, a fracturing fluid pumping schedule, a proppant pumping schedule, and a proppant rate;
    identifying a command to update a plurality of proxy models that comprise the selected proxy model; and
    updating the plurality of proxy models with the first principles model, comprising:
        adjusting the first principles model with updated measured data associated with the hydraulic fracturing operation to generate updated model outputs of the first principles model;
        adjusting the plurality of proxy models based on the adjusted first principles model to generate a plurality of updated model outputs of the proxy models;
        comparing the plurality of updated model outputs of the proxy models with the updated measured data; and
        based on one or more deviations determined by the comparison, further adjusting the plurality of updated model outputs of the proxy models.

2. The computer-implemented method of claim 1, where the command comprises at least one of:
    an instruction from an operator of the hydraulic fracturing operation;
    a predetermined time delay
    a receipt of updated measured data associated with the hydraulic fracturing operation; or
    a determination that a deviation of model outputs of the plurality of proxy models and model outputs of the first principles model exceeds a threshold.

3. The computer-implemented method of claim 1, further comprising:
    adjusting the modeled output based on measured data associated with the hydraulic fracturing operation; and
    determining the control setpoint for hydraulic fracturing operation equipment based on the adjusted modeled output.

4. The computer-implemented method of claim 3, where adjusting the modeled output based on measured data associated with the hydraulic fracturing operation comprises:
adjusting the modeled output by a control algorithm that optimizes an objective function by an optimization process, the optimization process comprising a combination of a prediction technique and an optimization technique; and
correcting the adjusted modeled output for one or more prediction errors of the selected proxy model.

5. The computer-implemented method of claim 4, where:
the prediction technique comprises a single selected model and the optimization technique comprises a standard model predictive control; or
the prediction technique comprises a fuzzy logic inference, and the optimization technique comprises a fuzzy logic model predictive control.

6. The computer-implemented method of claim 4, where the objective function comprises a cost function that comprises a weighting factor, an estimated final fracture conductivity, and a desired final fracture conductivity, the method further comprising:
minimizing the cost function; and
adjusting the selected proxy model based on an output of the minimized cost function.

7. The computer-implemented method of claim 1, where a plurality of subterranean zones are hydraulically fractured from a plurality of wellbores based on the control output.

8. A computer program product encoded on a non-transitory storage medium, the product comprising non-transitory, computer readable instructions for causing one or more processors to perform operations comprising:
receiving a selection of a proxy model of a hydraulic fracturing operation, the proxy model comprising at least one property of a plurality of properties of a first principles model associated with the hydraulic fracturing operation, wherein the selected proxy model is a simplified, lower order representation of the first principles model of the hydraulic fracturing operation;
simulating the selected proxy model to generate a modeled output based on the property;
determining, based on the modeled output, at least one of a value of a control setpoint for hydraulic fracturing operation equipment or a value of a variable manipulated by a control system communicably coupled to the hydraulic fracturing operation equipment;
controlling in real-time the hydraulic fracturing operation equipment based on the control setpoint or the value of the manipulated variable to hydraulically fracture a subterranean zone from a wellbore, wherein:
the plurality of properties comprise one or more of a fracture geometry, fracture dimensions, or conductivity; and
the generated modeled output includes a fracturing fluid flow rate, a fracturing fluid pumping schedule, a proppant pumping schedule, and a proppant rate
identifying a command to update a plurality of proxy models that comprise the selected proxy model; and
updating the plurality of proxy models with the first principles model, comprising:
adjusting the first principles model with updated measured data associated with the hydraulic fracturing operation to generate updated model outputs of the first principles model;
adjusting the plurality of proxy models based on the adjusted first principles model to generate a plurality of updated model outputs of the proxy models;
comparing the plurality of updated model outputs of the proxy models with the updated measured data; and
based on one or more deviations determined by the comparison, further adjusting the plurality of updated model outputs of the proxy models.

9. The computer program product of claim 8, where the command comprises at least one of:
an instruction from an operator of the hydraulic fracturing operation;
a predetermined time delay;
a receipt of updated measured data associated with the hydraulic fracturing operation; or
a determination that a deviation of model outputs of the plurality of proxy models and model outputs of the first principles model exceeds a threshold.

10. The computer program product of claim 8, where the operations further comprise:
adjusting the modeled output based on measured data associated with the hydraulic fracturing operation; and
determining the control setpoint for hydraulic fracturing operation equipment based on the adjusted modeled output.

11. The computer program product of claim 10, where adjusting the modeled output based on measured data associated with the hydraulic fracturing operation comprises:
adjusting the modeled output by a control algorithm that optimizes an objective function by an optimization process, the optimization process comprising a combination of a prediction technique and an optimization technique; and
correcting the adjusted modeled output for one or more prediction errors of the selected proxy model.

12. The computer program product of claim 11, where:
the prediction technique comprises a single selected model and the optimization technique comprises a standard model predictive control; or
the prediction technique comprises a fuzzy logic inference, and the optimization technique comprises a fuzzy logic model predictive control.

13. The computer program product of claim 11, where the objective function comprises a cost function that comprises a weighting factor, an estimated final fracture conductivity, and a desired final fracture conductivity, the method further comprising:
minimizing the cost function; and
adjusting the selected proxy model based on an output of the minimized cost function.

14. The computer program product of claim 8, where a plurality of subterranean zones are hydraulically fractured from a plurality of wellbores based on the control output.

15. A system of one or more computers configured to perform operations comprising:
receiving a selection of a proxy model of a hydraulic fracturing operation, the proxy model comprising at least one property of a plurality of properties of a first principles model associated with the hydraulic fracturing operation, wherein the selected proxy model is a simplified, lower order representation of the first principles model of the hydraulic fracturing operation;
simulating the selected proxy model to generate a modeled output based on the property;
determining, based on the modeled output, at least one of a value of a control setpoint for hydraulic fracturing operation equipment or a value of a variable manipulated by a control system communicably coupled to the hydraulic fracturing operation equipment;

controlling in real-time the hydraulic fracturing operation equipment based on the control setpoint or the value of the manipulated variable to hydraulically fracture a subterranean zone from a wellbore, wherein:
- the plurality of properties comprise one or more of a fracture geometry, fracture dimensions, or conductivity; and
- the generated modeled output includes a fracturing fluid flow rate, a fracturing fluid pumping schedule, a proppant pumping schedule, and a proppant rate;

identifying a command to update a plurality of proxy models that comprise the selected proxy model; and updating the plurality of proxy models with the first principles model, comprising:
- adjusting the first principles model with updated measured data associated with the hydraulic fracturing operation to generate updated model outputs of the first principles model;
- adjusting the plurality of proxy models based on the adjusted first principles model to generate a plurality of updated model outputs of the proxy models;
- comparing the plurality of updated model outputs of the proxy models with the updated measured data; and
- based on one or more deviations determined by the comparison, further adjusting the plurality of updated model outputs of the proxy models.

16. The system of claim 15, where the command comprises at least one of:
- an instruction from an operator of the hydraulic fracturing operation;
- a predetermined time delay;
- a receipt of updated measured data associated with the hydraulic fracturing operation; or
- a determination that a deviation of model outputs of the plurality of proxy models and model outputs of the first principles model exceeds a threshold.

17. The system of claim 15, where the operations further comprise:
- adjusting the modeled output based on measured data associated with the hydraulic fracturing operation; and
- determining the control setpoint for hydraulic fracturing operation equipment based on the adjusted modeled output.

18. The system of claim 17, where adjusting the modeled output based on measured data associated with the hydraulic fracturing operation comprises:
- adjusting the modeled output by a control algorithm that optimizes an objective function by an optimization process, the optimization process comprising a combination of a prediction technique and an optimization technique; and
- correcting the adjusted modeled output for one or more prediction errors of the selected proxy model.

19. The system of claim 18, where:
- the prediction technique comprises a single selected model and the optimization technique comprises a standard model predictive control; or
- the prediction technique comprises a fuzzy logic inference, and the optimization technique comprises a fuzzy logic model predictive control.

20. The system of claim 19, where the objective function comprises a cost function that comprises a weighting factor, an estimated final fracture conductivity, and a desired final fracture conductivity, the method further comprising:
- minimizing the cost function; and
- adjusting the selected proxy model based on an output of the minimized cost function.

21. The system of claim 15, where a plurality of subterranean zones are hydraulically fractured from a plurality of wellbores based on the control output.

* * * * *

UNITED STATES PATENT AND TRADEMARK OFFICE
CERTIFICATE OF CORRECTION

PATENT NO. : 10,408,021 B2  
APPLICATION NO. : 15/025408  
DATED : September 10, 2019  
INVENTOR(S) : Jason D. Dykstra and Qiuying Gu Page 1 of 1

It is certified that error appears in the above-identified patent and that said Letters Patent is hereby corrected as shown below:

In the Specification

Column 11, Line 34, delete "$\min\left(\alpha(\hat{C}_f - C_f^*)^2 + \beta f(shape)\right) + \gamma g(input\_trajectory)$" and insert --$\min\left(\alpha(\hat{C}_f - C_f^*)^2 + \beta * f(shape)\right) + \gamma g(input\_trajectory)$--

Signed and Sealed this  
Fifth Day of November, 2019

Andrei Iancu  
*Director of the United States Patent and Trademark Office*